United States Patent [19]
Ueno et al.

[11] Patent Number: 5,521,424
[45] Date of Patent: May 28, 1996

[54] SEMICONDUCTOR DEVICE HAVING A SILICON OXIDE FILM CONTAINING FLUORINE ATOMS

[75] Inventors: Kazuyoshi Ueno; Tetsuya Homma, both of Tokyo, Japan

[73] Assignee: NEC Corporation, Tokyo, Japan

[21] Appl. No.: 361,536

[22] Filed: Dec. 22, 1994

[30] Foreign Application Priority Data

Dec. 24, 1993 [JP] Japan .................................. 5-327201

[51] Int. Cl.⁶ .................................................. H01L 23/58
[52] U.S. Cl. ........................... 257/632; 257/635; 257/760
[58] Field of Search ..................................... 257/760, 761, 257/632, 635, 645, 773

[56] References Cited

U.S. PATENT DOCUMENTS 5,005,067  4/1991  Sakata et al. ............................. 257/760

OTHER PUBLICATIONS

T. Fukase et al., "A Margin–Free Contact Process Using An Al₂O₃ Etch–Stop Layer for High Density Devices", IEDM 92–837, pp. 33.3.1–33.3.4.

R. D. J. Verhaar et al., "A 25 μm² Bulk Full CMOS SRAM Cell Technology with Fully Overlapping Contacts", IEDM 90–473, pp. 18.2.1–18.2.4.

B. Luther et al., "Planar Copper–Polyimide Back End of the Line Interconnections for ULSI Devices", VMIC Conference, Jun. 8–9, 1993, pp. 15–21.

D. Vender et al., "Selective Reactive Ion Etching of Phosphorus–Doped Oxide Over Undoped $SiO_2$", J. Vac. Sci. Technol. A11(2), Mar./Apr. 1993, pp. 279–285.

*Primary Examiner*—William Mintel
*Assistant Examiner*—Roy Potter
*Attorney, Agent, or Firm*—Young & Thompson

[57] ABSTRACT

The semiconductor device has a multilayer structure wherein a substantially pure silicon dioxide film containing substantially no fluorine atom and a silicon dioxide film containing fluorine atoms are sequentially laminated on a substrate. Etching rate of a silicon dioxide film depends on a fluorine concentration in the film, so that a suitable etch selectivity of the silicon dioxide film containing fluorine atoms from the substantially pure silicon dioxide film can be obtained to form an oxide trench used for a trench interconnection and a via-hole used for a via-plug. The oxide film containing fluorine atoms has as good a quality as the silicon dioxide film not containing impurities has, thereby obtaining a superior characteristic of the semiconductor device. Addition of fluorine atoms reduces a specific permittivity to thereby obtain a higher speed.

14 Claims, 4 Drawing Sheets

SEMICONDUCTOR DEVICE HAVING A SILICON OXIDE FILM CONTAINING FLUORINE ATOMS

BACKGROUND OF THE INVENTION

1. Field of the Invention

The present invention relates to a semiconductor device and, more particularly, to a semiconductor device in which an etching of silicon oxide film can be stopped at a predetermined position.

2. Description of the Related Art

Such a semiconductor device is known in which a plurality of insulating films having different etching rates are successively deposited. The structure is employed either for an automated stop in an etching to make a trench or a hole or for making a self-aligned via-hole between interconnection patterns or between an interconnection pattern and an active region.

FIG. 1 is a schematic cross-sectional view of a conventional semiconductor device described in the Proceedings of International Symposium on VMIC (VLSI Multilevel Interconnection Conference), P. 15 (June, 1993). In the semiconductor device, an interconnection layer 17 is formed within a trench formed in laminated insulating films including polyimide films 15 and silicon nitride films 16 deposited on a substrate 1. The silicon nitride film 16 functions here as an etch-stop layer for blocking an etching executed for patterning the polyimide film 15.

In addition to the combination of polyimide and silicon nitride films as described above, other combinations of insulating films which allow a selective etching include a combination of a silicon dioxide film which contains phosphorus atoms or boron atoms and a substantially pure silicon dioxide film which does not substantially contain impurities (described in the Journal of Vacuum Science and Technology A, Vol. 11, P. 279 (1993)), a combination of a silicon dioxide film and an aluminum oxide film (described in the Technical Digest of IEDM (International Electron Devices Meeting), P. 837 (1992) and a combination of a silicon dioxide film and a silicon nitride film (described in the Technical Digest of IEDM, P. 473 (1990)).

When two or more kinds of insulating films having different etching rates are used in a semiconductor device for the purposes described above, the difference in etching rates should be sufficiently large to obtain a high selectivity and each of the combined films should not adversely affect the device characteristics. The aforesaid combinations, however, have problems as described below.

In a case of a combination of a silicon dioxide film which contains phosphorus or boron atoms and a substantially pure silicon dioxide film, gases containing moistures are released during etching for forming contact-holes (via-holes used for a first-level interconnection, being referred to as "via-holes" hereinafter) or via-holes, thereby rendering the electric characteristics of semiconductor devices unstable because of a highly hygroscopic property in an oxide film containing phosphorus or boron atoms. When those films are used as an interlayer insulating film, moisture contained therein causes a corrosion in a metallic interconnection, deteriorating a reliability of semiconductor devices. Similarly, in the case of a combination of a polyimide film and a silicon nitride film, all of released gases, a high hygroscopic property and a thermal instability of the polyimide film adversely affect the device characteristics of semiconductor devices.

Further, in a case of a combination of a silicon nitride and a silicon dioxide films, a difference in electric characteristics between two films such as permittivity induces a band discontinuity at the interface therebetween while an intermittent deposition is likely to induce an interfacial energy level. Those band discontinuity and interfacial levels are apt to trap the electric charges at the interface during a plasma processing. The trapped charges have an adverse effect on the semiconductor device characteristics, for example, shifts or fluctuations in threshold voltage of FETs in the semiconductor devices.

Furthermore, in a case of a combination of a silicon dioxide film and an aluminum oxide film, problems similar to those of the combination of a silicon nitride film and a silicon dioxide film will arise because the film properties are greatly different from each other. The fluctuations in the device characteristics described above cause a deviation from designed specifications as well as cause malfunctions in the operation of the electric circuits formed in the semiconductor device.

SUMMARY OF THE INVENTION

In view of the foregoing, it is an object of the present invention to provide a semiconductor device having a combination of insulating films which scarcely suffers from the aforesaid problems.

A semiconductor device according to the present invention comprises a film of a multilayer structure or a single layer structure. In both cases, the fluorine concentration of a silicon oxide film differs in each of layers or film portions. The structure is implemented, for instance, by a first silicon oxide film not containing a significant amount of fluorine atoms and a second silicon oxide film containing a significant amount of fluorine atoms formed on the first silicon oxide film. Alternatively, the structure is implemented by a single silicon oxide film including a first film portion not containing a significant amount of fluorine atoms and a second film portion containing a signficant amount of fluorine atoms, the first film portion and the second film portion being arranged in a direction perpendicular to the surface of the film. The silicon oxide film has therein a cavity, i.e., a trench or through-hole defining a peripheral portion such as an opening adjacent to the first silicon oxide film, and an interconnection layer is formed within the cavity.

Alternatively, the semiconductor device according to the present invention has a multilayer thin-film structure including a first silicon oxide film having a significant amount of fluorine atoms and a second silicon oxide film having fluorine atoms in a concentration significantly higher than the concentration the first silicon oxide has, or a monolayer thin-film structure wherein the fluorine concentration is different between the upper and lower portions thereof.

In the present invention, if the first silicon oxide film or first portion does not contain a significant amount of fluorine, preferable concentration of fluorine in the second silicon oxide film or second film portion is in the range between about 15% and about 20%. If the first silicon oxide film contains a significant amount of fluorine, preferable difference in concentration between the first silicon oxide film and second oxide film is in the range between about 15% and about 20%. If the concentration of fluorine, however, exceeds about 20% in the second silicon oxide film or second film portion, film quality of the second silicon oxide film or second film portion may deteriorate.

According to a preferred embodiment of the present invention, the silicon oxide film, which contains or does not substantially contain fluorine atoms and functions as an interlayer insulating film, contains phosphorus and/or boron atoms as dopant atoms. In a case where a first silicon oxide film not containing a significant amount of fluorine atoms is used together with a second silicon oxide film containing significant amount of fluorine atoms, the first silicon oxide film may be any of the upper layer and the lower layer. Similarly, in a case of a single silicon oxide film, a first film portion having a lower concentration of fluorine atoms may be any of the upper film portion and the lower portion.

With the present invention, the etch-rate is different between the first silicon dioxide film or the first film portion which does not contain a significant amount of fluorine atoms and the second silicon dioxide film or the second film portion which contains a significant amount of fluorine atoms or which has a higher fluorine concentrations. On the other hand, each of those silicon dioxide films or film portions has film properties similar to those of the other no matter whether a fluorine existence or a fluorine concentration may be in the films. Consequently, the semiconductor device according to the present invention can provide an effective selectivity in an etching step of a laminated structure including silicon dioxide films and is more free from deteriorations in device characteristics and fluctuations in threshold voltage caused by the difference between the film properties.

BRIEF DESCRIPTION OF THE DRAWINGS

The above and other objects, features and advantages of the present invention will be more apparent from the following description, referring to the accompanying drawings in which.

DESCRIPTION OF THE PREFERRED EMBODIMENTS

Embodiments of the present invention will now be described with reference to the drawings. Referring to FIGS. 2A–2E, there is shown a semiconductor device according to a first embodiment of the present invention having an interconnection layer formed within a cavity or an oxide trench. Description will be made thereto with reference to manufacturing steps thereof.

Figure 1:
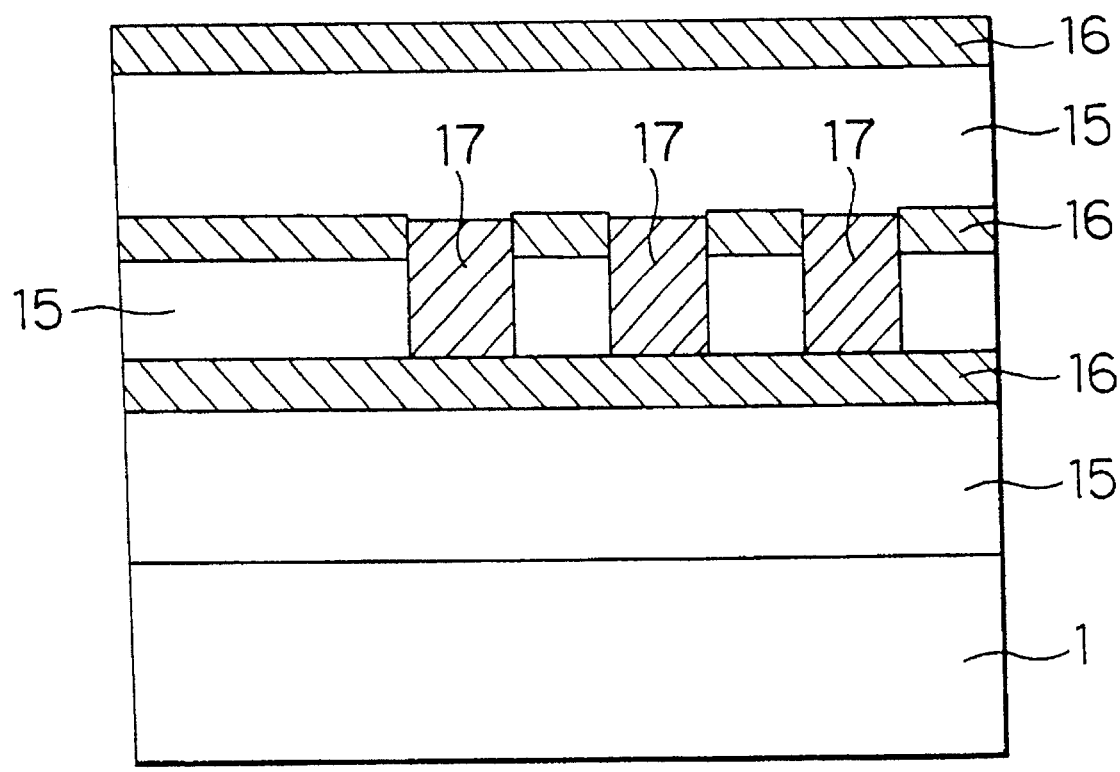
FIG. 1 is a cross-sectional view showing a conventional semiconductor device.
Figure 2A:
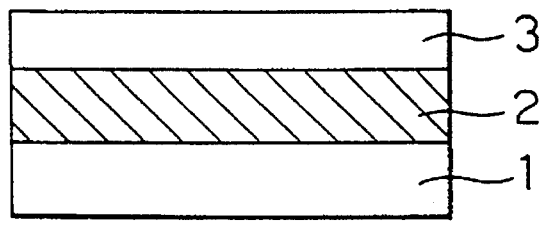
FIGS. 2A–2E are cross-sectional views of a semiconductor device according to a first embodiment of the present invention in consecutive steps of a manufacturing process thereof.

As shown in FIG. 2A, a first silicon dioxide film 2 which has a thickness of 400 nm and does not substantially contain any impurities and a second silicon dioxide film 3 which has a thickness of 300 nm and contains a significant amount of fluorine atoms are deposited on a semiconductor substrate 1 in this order. The first silicon dioxide film 2 is deposited by a chemical vapor deposition (CVD) process using silane and oxygen as material gases. In the CVD process, the substrate temperature is maintained at about 430° C. while a ratio of oxygen to silane in gas flow rate is about 10:1.

The second silicon dioxide film 3 containing fluorine atoms is deposited by a thermal reaction using an oxygen gas, vaporized TEOS (tetra-ethoxy-silane, $Si(OEt)_4$) and FTES (fluoro-tri-ethoxy-silane, $FSi(OEt)_3$) as material gases. In the thermal reaction process, the substrate temperature is maintained at about 200° C. The oxygen gas is introduced into an ozone generator to produce an $O_3$ at a concentration of about 20000 ppm, which is then used for a reaction. TEOS and FTES liquids, which are maintained at about 60° C., are evaporated by bubbling with nitrogen gas, then supplied to a reaction chamber together with the nitrogen gas. As a result, SiOF with a fluorine (F) content of 15% in an atomic ratio is deposited. In this embodiment, a thermochemical reaction is employed for forming each of films. However, a CVD (Chemical Vapor Deposition) reaction using a plasma or a photochemistry may be employed for forming the substantially pure silicon dioxide film as well as the silicon dioxide film including fluorine atoms.

Figure 2B:
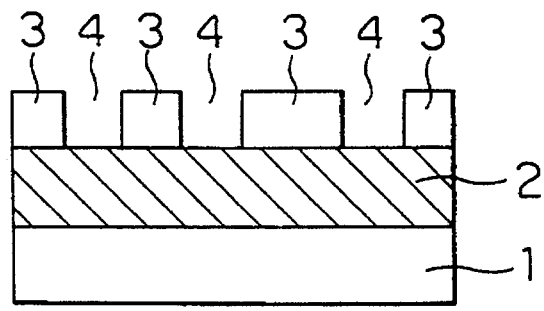

Subsequently, oxide trench pattern 4 for enveloping an interconnection are formed in the second silicon dioxide film 3 as shown in FIG. 2B. The process may be, for example, a RIE process using $CHF_3$ plasma. In the RIE process performed for patterning the second silicon dioxide film 3, a constituent silicon atoms are enhanced to be released in the form of $SiF_4$ as a result of reaction with fluorine atoms included in the film itself. Hence, the second silicon dioxide film 3 containing fluorine atoms has a higher etching rate than that of the first silicon dioxide film 2 substantially not containing fluorine atoms. An etching to form the oxide trench pattern 4 for embedding the interconnections, therefore, is blocked substantially at the interface between the substantially pure first silicon dioxide film 2 which has a lower etching rate and the second silicon dioxide film 3.

In place of the substantially pure silicon dioxide film 2, a first silicon dioxide film having a fluorine concentration lower than that of a second silicon dioxide film 3 containing a significant amount of fluorine atoms may be used. Furthermore, a single silicon dioxide film having a fluorine concentration different in the direction perpendicular to the film surface may be used. In this case, a silicon dioxide film is formed by successively depositing a plurality of film portions having different fluorine concentrations starting with a lowest fluorine concentration to a highest concentration or vice versa. The fact that etch-rate depends on a fluorine concentration is utilized to stop etching of the silicon dioxide film automatedly at a desired depth.

Figure 2C:
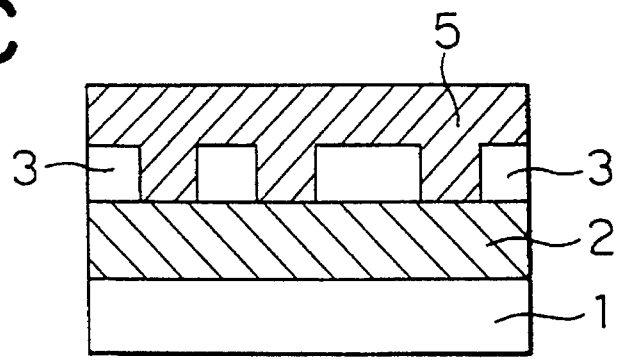
Figure 2D:
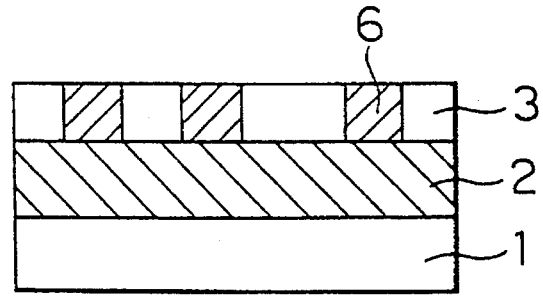
Figure 2E:
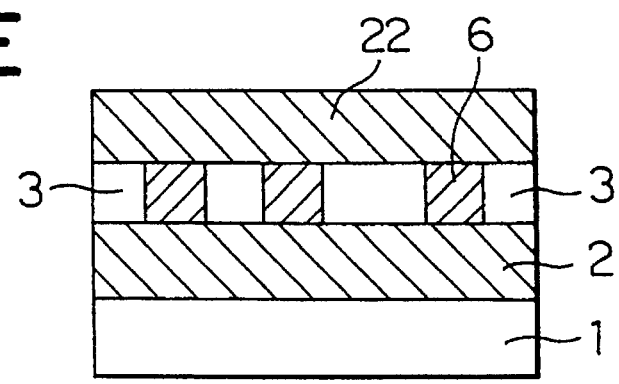

Subsequently, an aluminum film 5 is deposited covering the entire main surface of the semiconductor substrate 1 including the oxide trench pattern 4 and the second silicon dioxide film 3 as shown in FIG. 2C by use of an argon sputtering of aluminum target, with tile substrate temperature being kept at about 500° C. The aluminum film 5 is then subjected to a CMP (Chemical and Mechanical Polishing) step so as to leave aluminum trench interconnections 6 within the oxide trench 4 as shown in FIG. 2D. Subsequently, a 400 nm thick substantially pure $SiO_2$ film 22 is deposited by a CVD process to cover the aluminum trench interconnections 6, whereby a final structure is obtained as shown in FIG. 2E.

In the semiconductor device according to the first embodiment, either an upper layer of the laminated oxide films or an upper portion of a single oxide film contains SiOF. The specific permittivity of SiOF is about 3.4, about 15% lower than that of a substantially pure silicon dioxide film which is about 4.0. Accordingly, a parasitic capacitance of the interconnection in the present embodiment is smaller than that in a conventional semiconductor device employing a substantially pure $SiO_2$. As a result, a crosstalk between interconnections can be reduced while a propagation delay of an input signal can be also reduced in the present embodiment as compared with the conventional semiconductor device.

In the case of a combination of a silicon nitride film and a silicon dioxide film employed in a conventional semiconductor device, the specific permittivities of those films are 7.5 and 4.0, respectively, indicating remarkably different values. On the other hand, in the semiconductor device according to the present embodiment, the specific permittivities of the silicon dioxide and SiOF films are 4.0 and 3.7, respectively, indicating relatively similar values. Consequently, the charge trapping caused by a difference in permittivity between the films is less likely to occur in the interface between the silicon dioxide and the SiOF films resulting in a reduction in fluctuations or shifts in the device characteristics due to such built-up charges.

In the present embodiment, at least one of the substantially pure silicon dioxide film 2 containing substantially no fluorine atom and the silicon dioxide film 3 containing a significant amount of fluorine atoms may be doped with either phosphorus or boron atoms. An addition of phosphorus or boron atoms provides a dioxide film especially suited to an interlayer insulating film.

A semiconductor device according to a second embodiment of the present invention will now be described with reference to FIGS. 3A–3D showing cross-sectional views of the structures in consecutive steps of a manufacturing process.

Figure 3A:
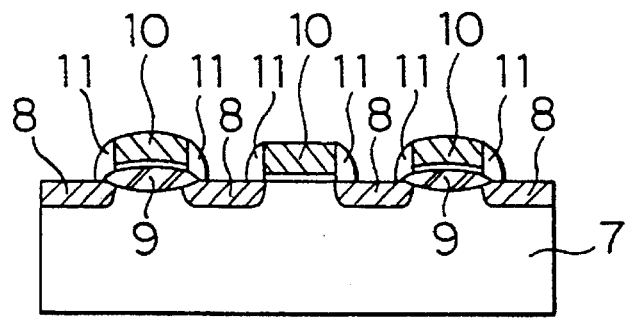
FIGS. 3A–3D are cross-sectional views of a semiconductor device according to a second embodiment of the present invention in consecutive steps of a manufacturing process thereof.

As shown in FIG. 3A, a diffused layer 8 is formed in a silicon substrate 7, a field oxide film 9 is formed for device isolation by a known selective oxidation technology such as LOCOS (Local Oxidation of Silicon) technique, and then gate electrodes 10 and sidewall oxide spacers 11 are formed by known techniques.

Figure 3B:
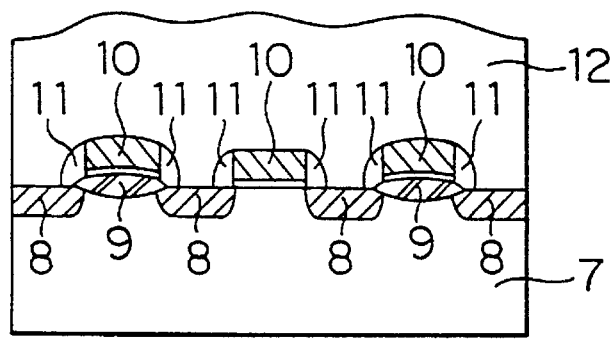

As shown in FIG. 3B, a first silicon dioxide film 12 containing significant amount of fluorine atoms is deposited to a thickness of 600 nm. The deposition of the first silicon dioxide film 12 is performed by a thermal reaction using oxygen, evaporated TEOS $(Si(OEt)_4)$ and FTES $(FSi(OEt)_3)$ gases as source materials.

Figure 3C:
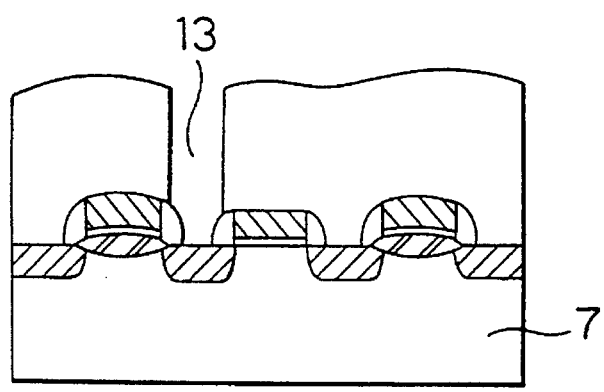

As shown in FIG. 3C, the first silicon dioxide film 12 is selectively etched by a RIE technology to form a via-hole 13 with the diffused layer 8 being exposed at a bottom thereof. In the RIE process, the oxide spacers 11 located in the via-hole 13 are hardly etched because of a difference in etching rate between a first silicon dioxide film containing fluorine atoms and a substantially pure silicon dioxide spacers 11. Accordingly, the effective via-hole 13 for exposing the diffused layer 8 is made aligned to a gate electrode structure in a self-aligning manner, thereby without degrading device characteristics even when a mask size of the via-hole 13 is designed to have a larger diameter than a width of the diffused layer 8.

Namely, the effective via-hole is made in a self-aligned manner, so that an alignment margin required in a conventional device between the diffused layer 8 and the via-hole 13 is unnecessary any more in the present embodiment, which can consequently increase an integration density of ICs.

Although a silicon nitride film forming the sidewall spacers 11 may render the alignment margin unnecessary instead of the construction of the present embodiment, differences in characteristics between the silicon nitride film and the silicon dioxide film will affect the device characteristics in the combination of the silicon nitride film and silicon dioxide film. In the present embodiment, the difference in characteristics between the silicon dioxide film which contains substantial amount of fluorine atoms and the substantially pure silicon dioxide film is too small to significantly affect the device characteristics on the contrary.

Figure 3D:
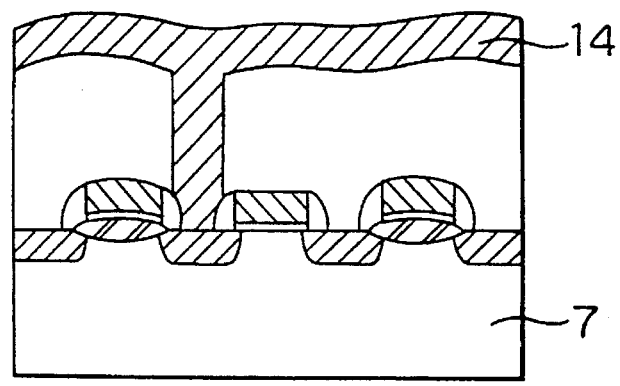

A tungsten (W) film is then deposited, for example, as an interconnction layer by use of a blanket CVD technology on the entire surface of the device as shown in FIG. 3D, thereby filling up the via-hole 13 with the tungsten film 14. The tungsten film 14 is then subjected to patterning to form tungsten plugs and interconnection layers.

In an ordinary RIE process carried out for a silicon dioxide film by using carbon tetrafluoride $(CF_4)$ or the like, a carbon monoxide gas, silicon and fluorine atoms generated on the silicon dioxide film by a chemical reaction proceed an etching process by desorbing themselves out of a silicon-fluorine compound surface which will be deposited on the oxide surface as byproducts. The silicon-fluorine compound is more likely to be generated on a silicon dioxide film containing significant amount of fluorine atoms than on a substantially pure silicon dioxide film which does not substantially contain fluorine atoms. The more fluorine atoms, the easier the silicon dioxide film is etched. As a result, the silicon dioxide film containing fluorine atoms has a higher etching rate as compared to the silicon dioxide film containing substantially no fluorine atom, thus allowing a selective etching of the silicon dioxide film containing fluorine atoms from the substantially pure silicon dioxide film. A selective etching is also available between silicon dioxide firms having different fluorine concentrations since an etching rate differs with a fluorine concentration.

A substantially pure silicon dioxide film and a silicon dioxide film containing fluorine atoms were subjected to an compositional analysis using an X-ray photoelectric spectroanalyzer. Analysis results verified that the substantially pure silicon dioxide film is $SiO_2$ in terms of stoichiometric composition while the silicon dioxide film containing fluorine atoms is $SiO_{1.85}F_{0.15}$. The silicon dioxide film containing fluorine atoms was proven clearly to contain only a reduced amount of moisture through infrared absorption spectra thereof. Accordingly, such a silicon dioxide film can be applied as an insulating film having a superior quality.

As described above in a thin-film structure according to the second embodiment, it is possible to perform a selective etching with a high selectivity while a silicon dioxide film containing fluorine atoms has as good a quality as a substantially pure silicon dioxide film has. Consequently, in the step for forming an interconnection layer in an oxide trench, etching rate-induced fluctuation in the depth of trench can be reduced. Accordingly, a uniformity in electric characteristics of the interconnection can be improved. Besides, an adverse effect on the device characteristics caused by trapped charges and the like can be minimized since the silicon dioxide film containing fluorine atoms is close in properties to the substantially pure silicon dioxide film. Moreover, the manufacturing costs of semiconductor devices can be reduced since the laminar structure can be formed using only a single thin-film grower.

Figure 4A:
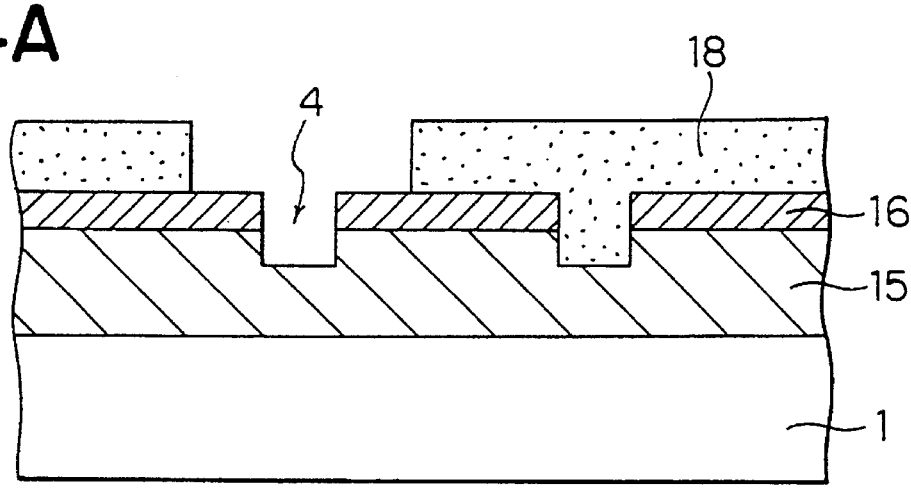
FIGS. 4A–4C are cross-sectional views of a semiconductor device according to a third embodiment of the present invention in consecutive steps of a manufacturing process thereof.

Now, a semiconductor device according to a third embodiment of the present invention will be described with reference to FIGS. 4A–4C. Those drawings are cross-sectional views of a semiconductor device in consecutive steps of a manufacturing process.

A first silicon dioxide film 15 containing fluorine atoms and a second silicon dioxide film 16 not containing a significant amount of Fluorine atoms are formed sequentially on the semiconductor substrate 1. An oxide trench pattern 4 for embedding an interconnection layer is formed in the first silicon dioxide film 15 containing fluorine atoms by a known process, with the bottom of the oxide trench Pattern 4 being located within the first silicon dioxide film 15.

Subsequently, a photoresist film pattern 18 is formed having an opening for exposing the oxide trench pattern 4 by a known photolithographic technology, thereby obtaining a structure shown in FIG. 4A. Incidentally, the opening formed in the photoresist film pattern 18 has a wider dimension than that of the oxide trench pattern 4.

Figure 4B:
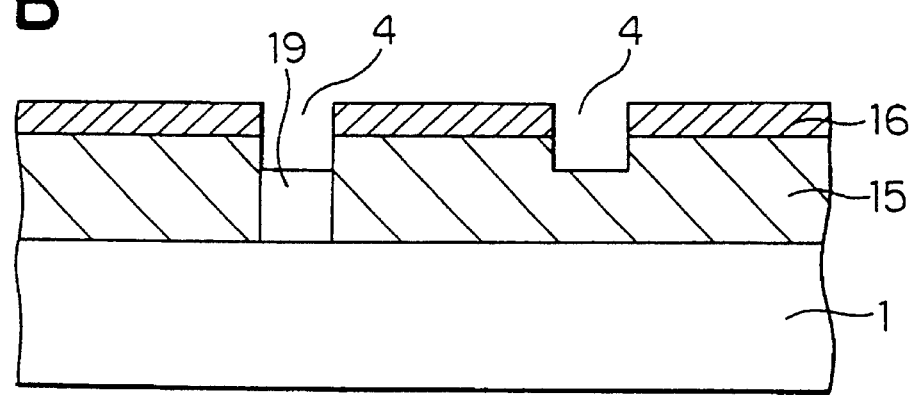
Figure 4C:
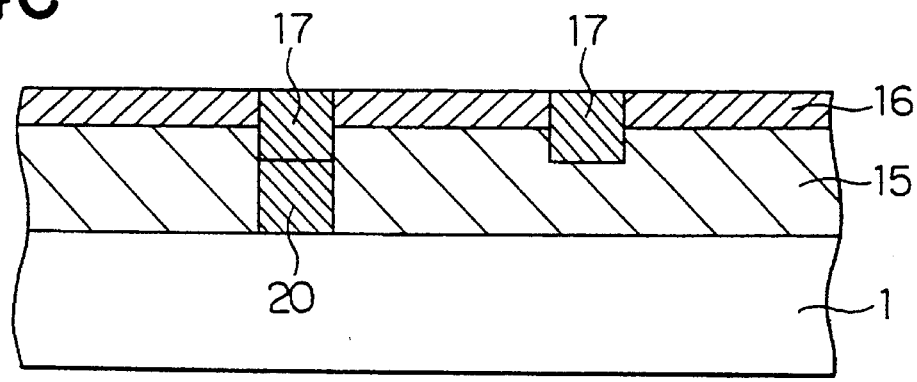

The first silicon dioxide film 15 containing fluorine atoms is then etched selectively using the photoresist film pattern 18 and the second oxide film 16 as a mask, thereby forming a via-hole 19 which reaches the substrate 1 as shown in FIG. 4B. The width of the via-hole 19 is made precisely equal to that of the trench pattern 4 due to the mask implemented by the substantially pure silicon dioxide film 16.

A metallic film is then deposited by sputtering or the like to fill the via-hole 19 and the oxide trench pattern 4 and to cover the entire surface of the second silicon dioxide film 16 containing substantially no fluorine atom. An etch-back performed on the metallic film forms a trench interconnection 17 embedded in the oxide trench pattern 4 and simultaneously a via-plug 20 buried in the via-hole 19 as shown in FIG. 4C. An alignment margin required in a conventional semiconductor device is not necessary in the embodiment because the via-plug 20 is self-aligned to the trench interconnection 17, which enables accordingly a higher integration of semiconductor devices.

The specific permittivity, i.e., 3.4 of the silicon dioxide film containing fluorine atoms is lower than that (4.0) of the silicon dioxide film containing substantially no impurity. Accordingly, the parasitic capacitance between each pair of interconnections in the semiconductor device according to the present embodiment can be reduced compared with the case of the first embodiment. Hence, a high signal propagation speed as well as a low crosstalk between interconnections can be obtained in the present embodiment.

Although the present invention is described with reference to the preferred embodiments, the present invention is not limited to such embodiments and it will be obvious for those skilled in the art that various modifications or alterations can be easily made based on the above embodiments within the scope of the present invention.

What is claimed is:

1. A semiconductor device comprising a substrate having a main surface, a first silicon oxide film formed overlying said main surface and being substantially free of fluorine atoms, a second silicon oxide film formed adjacent to said first silicon oxide film and containing a significant amount of fluorine atoms, said second silicon oxide film having therein a cavity defining a peripheral portion adjacent to said first silicon oxide film, and an interconnection layer formed within said cavity.

2. A semiconductor device as defined in claim 1 wherein said first silicon oxide film and said second silicon oxide film define therebetween an interface extending in parallel to said main surface.

3. A semiconductor device as defined in claim 1 wherein said first silicon oxide film is located lower than said second silicon oxide film.

4. A semiconductor device as defined in claim 1 wherein said first silicon oxide film is located higher than said second silicon oxide film.

5. A semiconductor device as defined in claim 1 wherein said cavity forms a trench pattern.

6. A semiconductor device as defined in claim 5 wherein said second silicon oxide film has a via-hole adjacent to said trench pattern.

7. A semiconductor device as defined in claim 1 wherein at least one of said first and second silicon oxide films contains at least one of phosphorous and boron.

8. A semiconductor device as defined in claim 1 wherein said first silicon oxide film constitutes a side wall of a gate electrode of a MOSFET and said second silicon oxide film constitutes an interlayer insulating film overlying said gate electrode.

9. A semiconductor device as defined in claim 1 wherein said first silicon oxide film and said second silicon oxide film have a specific permittivity of about 4.0 and 3.4, respectively.

10. A semiconductor device as defined in claim 1 wherein said first silicon oxide film has an etch rate lower than the etch rate of said second silicon oxide film in a reactive ion etching.

11. A semiconductor device as defined in claim 1 wherein said significant amount of fluorine atoms corresponds to a concentration between about 15% and about 20% of fluorine atoms in said second oxide film.

12. A semiconductor device comprising a substrate having a main surface, a silicon oxide film overlying said main surface and including a first film portion and a second film portion arranged in the direction perpendicular to said main surface, said first film portion having a first fluorine concentration, said second film portion having a second fluorine concentration higher than said first fluorine concentration by a significant amount.

13. A semiconductor device as defined in claim 12 wherein said first film portion has an etch rate lower than the etch rate of said second film portion in a reactive ion etching.

14. A semiconductor device as defined in claim 12 wherein difference between said first concentration and said second concentration is in the range between about 15% and about 20%.

\* \* \* \* \*